(12) United States Patent
Ausserlechner

(10) Patent No.: US 6,744,665 B2
(45) Date of Patent: Jun. 1, 2004

(54) MEMORY CELL CONFIGURATION

(75) Inventor: Udo Ausserlechner, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/368,331

(22) Filed: Feb. 18, 2003

(65) Prior Publication Data

US 2003/0147285 A1 Aug. 7, 2003

Related U.S. Application Data

(63) Continuation of application No. PCT/DE01/03119, filed on Aug. 16, 2001.

(30) Foreign Application Priority Data

Aug. 16, 2000 (DE) .......................................... 100 40 093

(51) Int. Cl.$^7$ ............................................. G11C 16/04
(52) U.S. Cl. ............................. 365/185.04; 365/189.05; 365/189.01
(58) Field of Search ....................... 365/185.04, 189.05, 365/189.01, 185.08, 154, 230.06, 230.08

(56) References Cited

U.S. PATENT DOCUMENTS

| | | | |
|---|---|---|---|
| 5,553,019 A | | 9/1996 | Sandvos et al. |
| 5,668,760 A | * | 9/1997 | Hazen ................... 365/189.01 |
| 5,845,332 A | | 12/1998 | Inoue et al. |
| 5,880,992 A | | 3/1999 | Lee |
| 5,991,197 A | * | 11/1999 | Ogura et al. ........... 365/185.11 |
| 6,041,007 A | | 3/2000 | Roeckner |

* cited by examiner

*Primary Examiner*—David Lam
(74) *Attorney, Agent, or Firm*—Laurence A. Greenberg; Werner H. Stemer; Ralph E. Locher

(57) ABSTRACT

A memory cell configuration has a nonvolatile memory that can be latched by a latching element. The nonvolatile memory is latched by activating a copy of the latching memory cell, which is coupled to the latching memory cell, and can be activated in a manner dependent on the operating state using an activation element. This makes it possible to identify and avoid incorrect programming, in particular in the case of calibratable sensors.

8 Claims, 1 Drawing Sheet

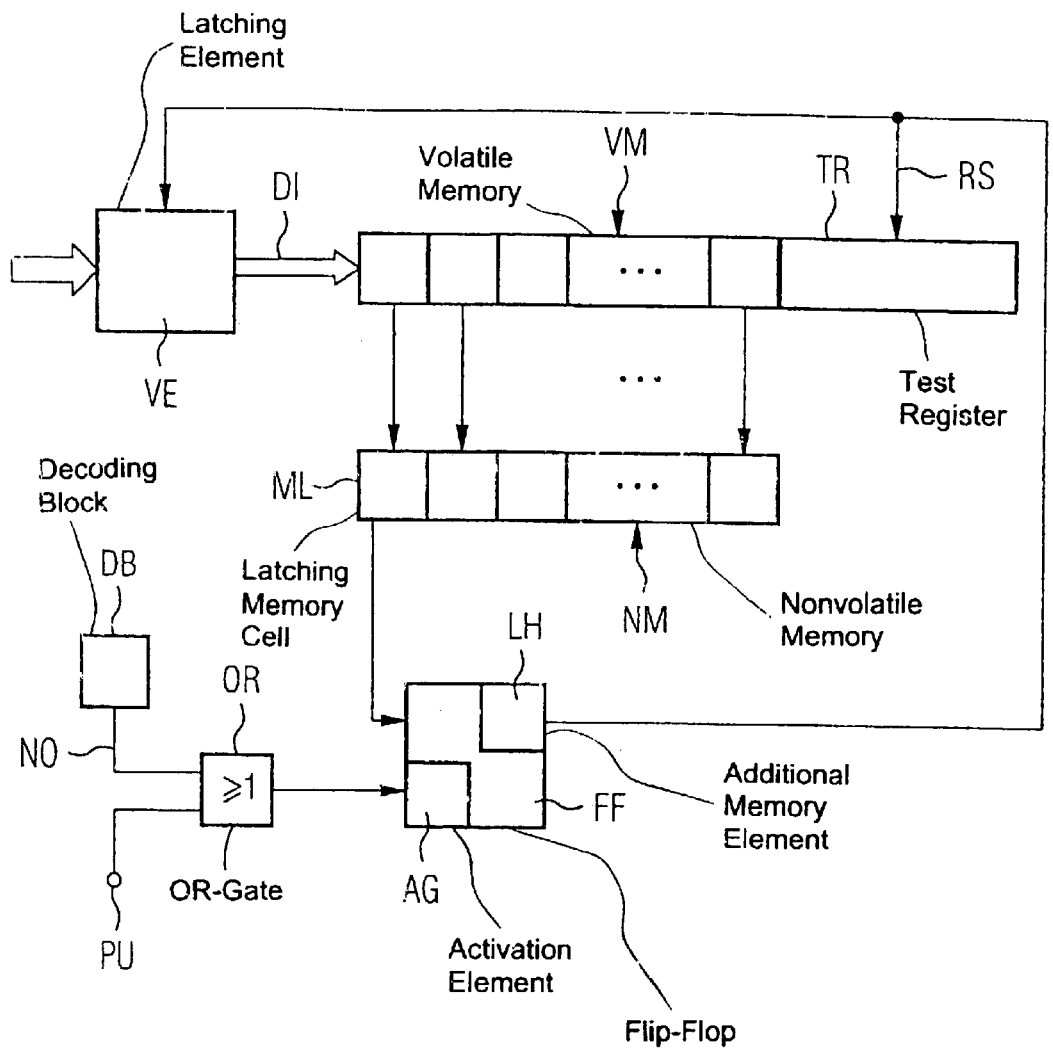

MEMORY CELL CONFIGURATION

CROSS-REFERENCE TO RELATED APPLICATION

This application is a continuation of copending International Application No. PCT/DE01/03119, filed Aug. 16, 2001, which designated the United States and was not published in English.

BACKGROUND OF THE INVENTION

FIELD OF THE INVENTION

The present invention relates to a memory cell configuration with read/write protection.

In the case of programmable integrated circuits, for example in the case of calibratable sensors, it may be desirable to protect the memory content of a nonvolatile memory after the one-time programming thereof in such a way that change or erasure is impossible.

U.S. Pat. No. 6,041,007 specifies an integrated circuit, preferably an electronic sensor, with a programmable memory cell designed as an EEPROM (Electrically Erasable Programmable Read Only Memory). In order to latch the memory cell, a latching memory cell is provided, which can be overwritten only when a signal that can be fed in externally is present.

Reprogramming of the programmable memory cells is no longer possible after the conclusion of production.

One possibility for protecting the memory content consists in setting a write protection bit for latching the memory at the end of a one-time programming. This makes it possible to prevent further programming or activation of test routines and to latch a data input present at the integrated circuit. It is thus ensured that only one operating state, the so-called normal operating mode, can be implemented after the conclusion of programming and after the setting of the latching bit.

By way of example, by applying an overvoltage to voltage supply terminals of the integrated circuit, it is usually possible to change from the normal operating mode to other modes, for example to a write mode, in which data are written to a nonvolatile memory. Furthermore, a test mode may be provided which enables a read-out of the nonvolatile memory, so that, by way of example, after each operation of writing a bit to the nonvolatile memory, it is possible to check whether this write operation has been effected in a manner free of errors.

In this case, however, the problem arises that if the latching bit is set in the nonvolatile memory, it is no longer possible to check that the write operation is free from errors, since only the normal operating mode can be implemented after the setting of the latching bit. The normal operating mode does not permit any test or read modes.

In particular, the problem can arise that when the latching bit is written in the nonvolatile memory, further memory cells of the nonvolatile memory are written to inadvertently. Such incorrect programming can remain undiscovered even in the event of extensive functional tests.

SUMMARY OF THE INVENTION

It is accordingly an object of the invention to provide a memory cell configuration that overcomes the above-mentioned disadvantages of the prior art apparatus of this general type.

In particular, it is an object of the invention to provide a memory cell configuration in which latching of a nonvolatile memory is provided and in which the correct programming of a latched memory area can be checked.

With the foregoing and other objects in view there is provided, in accordance with the invention, a memory cell configuration including: a nonvolatile memory including a latching memory cell for indicating a read protection and/or a write protection of the nonvolatile memory; a latching element for preventing read operations and/or write operations on the nonvolatile memory, the latching element coupled to the nonvolatile memory; and an additional memory element having an input coupled to the latching memory cell and an output connected to the latching element for driving the latching element.

In accordance with an added feature of the invention, the configuration includes an activation element for receiving an activation signal. The activation element provides information stored in the latching memory cell to the additional memory element, dependent on the activation signal.

In accordance with an additional feature of the invention, the configuration includes an OR gate having an output, a first input for receiving a switch-on phase indicator signal, and a second input for receiving a normal operating mode indicator signal. The activation element has an input connected to the output of the OR gate.

In accordance with another feature of the invention, the configuration includes a decoding block having an output connected to the second input of the OR gate. The decoding block provides the normal operating mode indicator signal to the OR gate.

In accordance with a further feature of the invention, the configuration includes a D-type flip-flop including the activation element and the additional memory element.

In accordance with another added feature of the invention, the configuration includes a volatile memory having an output connected to the nonvolatile memory. The volatile memory has a data input.

In accordance with another additional feature of the invention, the volatile memory area includes a test register.

In accordance with yet an added feature of the invention, the test register has a reset input, and the output of the additional memory element is connected to the reset input of the test register.

In the case of the memory cell configuration described, the latching of the nonvolatile memory is not effected directly by setting a bit thereof, but rather the latching is effected by the additional memory element coupled to the latching element of the nonvolatile memory. The provision of such a latched copy of the latching memory cell of the nonvolatile memory, which copy can carry the latching bit (memory lock bit), enables, by way of example, a time-delayed activation of the additional memory element.

By way of example, depending on an operating mode of the memory cell configuration, the memory content of the latching memory cell, which may be 1 bit, can be switched through to the output of the additional memory element and can be continuously refreshed in a normal operating mode.

This makes it possible first to avoid inadvertent programming of the nonvolatile memory during operation due to latching thereof and also to check the freedom from errors in the programming operation with regard to the latching memory cell with a latching bit itself.

In an advantageous embodiment of the present invention, an activation element is provided, which effects a provision of information stored in the latching memory cell in the additional memory element in a manner dependent on an activation signal that can be fed to the activation element.

By way of example, a switch-on phase indicator signal may be fed as an activation signal to the activation element. The indicator signal is active during a switch-on phase of the memory cell configuration, or during a switch-on phase of an integrated circuit including the memory cell configuration and thus indicates the switch-on phase.

By setting a latching bit in the latching memory cell, the nonvolatile memory in the memory cell configuration is thus latched only when the memory cell configuration is switched on a next time after a programming.

In a further advantageous embodiment of the present invention, an OR gate has an output connected to an input of the activation element, an input fed with a switch-on phase indicator signal, and another input fed with a normal operating mode indicator signal.

By feeding in a normal operating mode indicator signal in addition to a switch-on phase indicator signal, the nonvolatile memory can be latched as early as after the conclusion of the programming of the nonvolatile memory and the beginning of the normal operating mode of the memory cell configuration. The possibility of checking the nonvolatile memory for error-free programming is preserved here.

In a further advantageous embodiment of the present invention, a decoding block provides the normal operating mode indicator signal. The output of the decoding block is connected to an input of the OR gate.

The decoding block can decode, for example, an increased operating voltage, which indicates a mode other than a normal operating mode, and in the case of a normal operating mode, provides a normal operating mode indicator signal at its output.

In a further advantageous embodiment of the present invention, a D-type flip-flop is provided, which includes the activation element and the additional memory element.

A D-type flip-flop enables a simple and reliable possibility for realizing the additional memory element and the activation thereof with an activation signal that can be fed to the clock input of the D-type flip-flop. In this case, the D input of the D-type flip-flop can be coupled to the latching memory cell.

In a further advantageous embodiment of the present invention, a volatile memory is provided, which has a data input and an output connected to the nonvolatile memory.

The data input of the volatile memory may be embodied as a serial data input. The data can be transferred in parallel from the volatile memory, which may be embodied as a register, to the nonvolatile memory. The latching element may be connected to the data input.

In a further advantageous embodiment of the present invention, the memory area of the volatile memory includes a test register. The test register may be required in a test mode.

In a further advantageous embodiment of the present invention, the output of the additional memory element is connected to a reset input of the test register. If a test register that can indicate an active test mode is provided, it is advantageous to reset the test register when the additional memory element is activated. In this case, the data input of the volatile memory can be latched at the same time.

Other features which are considered as characteristic for the invention are set forth in the appended claims.

Although the invention is illustrated and described herein as embodied in a memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The sole drawing FIGURE is a block diagram of an exemplary embodiment of a memory cell configuration.

DESCRIPTION OF THE PREFERRED EMBODIMENTS

Referring now to the sole drawing FIGURE, there is shown a volatile memory VM and a nonvolatile memory NM connected in parallel. The nonvolatile memory NM includes a latching memory cell (memory lock) ML. The volatile memory VM, which serves for loading the nonvolatile memory NM, has a memory structure corresponding to that of the nonvolatile memory NM. In addition, however, the volatile memory VM has a test register TR. The volatile memory VM has a data input DI that serves for serially loading the volatile memory. In this case, the latching bit for loading the latching memory cell ML is the last bit loaded into the volatile memory VM. Connected to the data input DI of the volatile memory VM is a latching element VE, which enables write operations, erase operations, and read operations at the volatile memory VM and thus at the nonvolatile memory NM. The latching element VE is controlled by an additional memory element LH provided in a flip-flop FF. The flip-flop FF is designed as a D-type flip-flop having an output connected to the control input of the latching element VE. The data input of the flip-flop FF is connected to the latching memory cell ML. The D-type flip-flop FF is embodied as a clock-state-controlled flip-flop FF which switches its input through to its output when a clock signal is present. For this purpose, the flip-flop FF has an activation element AG connected to the output of an OR gate OR. A switch-on phase indicator signal PU and a normal operating mode indicator signal NO can be fed to the inputs of the OR gate OR. For providing the normal operating mode indicator signal NO, a decoding block DB is connected to an input of the OR gate OR.

When data is fed in at the data input DI of the volatile memory VM and when the memory cell configuration is switched on for the first time, the latching bit in the latching memory cell ML is not yet set, and consequently, no latching of the data stream is active in the latching element VE. Accordingly, it is possible to carry out a read mode, for example, in which data are read from the data input DI into the volatile memory VM. Moreover, it is possible to execute a write mode, in which data are written from the volatile memory VM to the nonvolatile memory NM, and finally, it is possible to execute a test mode, in which data are written from the data input DI to the test register TR. In these operating modes, a setting of the mem-lock bit in the latching memory cell ML does not have the effect that the latching element VE latches the data input DI of the volatile memory VM. This is because even if the mem-lock bit in the latching memory cell ML is set, it is not switched through to the output of the flip-flop since neither a switch-on phase indicator signal PU nor a normal operating mode indicator signal NO is present at the input of the activation element AG. Accordingly, the content of the nonvolatile memory NM can now be checked in a test mode, for example by readout via a current interface. Consequently, incorrect programming of the nonvolatile memory NM can be precluded.

An activation of a normal operating mode causes a normal operating mode indicator signal NO to be available at the output of the decoding block BD, which signal activates the flip-flop FF via the activation element AG in such a way that the input of the flip-flop FF is switched through to the output of the flip-flop FF. Consequently, a copy of the bit of the latching memory cell is available in the additional memory element LH—that is to say at the output of the flip-flop FF. This has the result that, with a set latching bit in the latching memory cell ML, first the latching element VE latches the data input DI, and second the test register TR is reset via the reset input RS. Consequently, the memory cell configuration cannot subsequently be reprogrammed nor can the normal operating mode be interrupted. The feeding in of the switch-on phase indicator signal PU during a sufficiently long switch-on phase to the OR gate OR has the effect that the respective current memory content of the latching memory cell ML is taken over to the output of the flip-flop FF and thus into the additional memory element LH.

In order to leave a normal operating mode and activate a loading, test or write mode, an increased supply voltage can be applied to the memory cell configuration. This overvoltage, which is desired for programming the memory cell configuration, is undesirable, however, in a normal operating mode when interference signals activate the overvoltage mode. However, this does not jeopardize the operational reliability of the memory cell configuration since, even if the normal operating mode indicator signal NO changes to the low state, the content of the additional memory element LH is frozen and the latching unit VE continues to latch the data input DI since the latching memory cell had already been programmed beforehand.

In an alternate embodiment, the OR gate OR could be omitted and the switch-on phase indicator signal PU could be feed directly to the flip-flop FF. The decoding block DB and the OR gate OR can be omitted as a result of this, in which case. strong interference pulses of the supply voltage, during the operation of the memory cell configuration, could lead to a cancellation of the latching in the latching element VE.

In order to increase the operational reliability with respect to overvoltage or undervoltage caused by interference pulses, the OR gate OR shown in the figure could be replaced by an OR gate with four inputs. In this case, the normal operating mode indicator signal NO can be fed to a first input of the OR gate, the switch-on phase indicator signal PU can be fed to a second input, an undervoltage indicator signal can be fed at a third input, and the output of an AND gate can be feed to a fourth input. The inputs of that AND gate receive an overvoltage indicator signal and the memory content of the additional memory element LH.

Instead of a memory map of the nonvolatile memory NM, the volatile memory VM may merely have an address which points to the nonvolatile memory or a further memory.

Instead of the D-type flip-flop FF, a positive edge triggered flip-flop, for example, could be used. The clock input of the positive edge triggered flip-flop could be driven by a high-frequency clock signal only during the normal operating mode. Equally, the D-type flip-flop could be replaced by an RS flip-flop with corresponding additional gates.

I claim:

1. A memory cell configuration, comprising:
    a nonvolatile memory including a latching memory cell for indicating a read protection and/or a write protection of said nonvolatile memory;
    a latching element for preventing read operations and/or write operations on said nonvolatile memory, said latching element coupled to said nonvolatile memory; and
    an additional memory element having an input coupled to said latching memory cell and an output connected to said latching element for driving said latching element.

2. The memory cell configuration according to claim 1, comprising:
    an activation element for receiving an activation signal;
    said activation element providing information stored in said latching memory cell to said additional memory element, dependent on said activation signal.

3. The memory cell configuration according to claim 2, comprising:
    an OR gate having an output, a first input for receiving a switch-on phase indicator signal, and a second input for receiving a normal operating mode indicator signal;
    said activation element having an input connected to said output of said OR gate.

4. The memory cell configuration according to claim 3, comprising a decoding block having an output connected to said second input of said OR gate; said decoding block for providing said normal operating mode indicator signal to said OR gate.

5. The memory cell configuration according to claim 2, comprising a D-type flip-flop including said activation element and said additional memory element.

6. The memory cell configuration according to claim 1, comprising:
    a volatile memory having an output connected to said nonvolatile memory;
    said volatile memory having a data input.

7. The memory cell configuration according to claim 6, wherein said volatile memory area includes a test register.

8. The memory cell configuration according to claim 7, wherein:
    said test register has a reset input; and
    said output of said additional memory element is connected to said reset input of said test register.

* * * * *